United States Patent
Rupp et al.

(10) Patent No.: US 9,245,944 B2
(45) Date of Patent: Jan. 26, 2016

(54) SILICON CARBIDE DEVICE AND A METHOD FOR MANUFACTURING A SILICON CARBIDE DEVICE

(71) Applicant: Infineon Technologies AG, Neubiberg (DE)

(72) Inventors: Roland Rupp, Lauf an der Pegnitz (DE); Christian Hecht, Buckenhof (DE); Bernd Leonhard Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 3 days.

(21) Appl. No.: 13/933,686

(22) Filed: Jul. 2, 2013

(65) Prior Publication Data
US 2015/0008447 A1    Jan. 8, 2015

(51) Int. Cl.
| | |
|---|---|
| *H01L 29/15* | (2006.01) |
| *H01L 29/06* | (2006.01) |
| *H01L 29/16* | (2006.01) |
| *H01L 29/32* | (2006.01) |
| *H01L 29/34* | (2006.01) |
| *H01L 29/66* | (2006.01) |
| *H01L 29/78* | (2006.01) |

(52) U.S. Cl.
CPC ........ *H01L 29/0607* (2013.01); *H01L 29/1608* (2013.01); *H01L 29/32* (2013.01); *H01L 29/34* (2013.01); *H01L 29/66068* (2013.01); *H01L 29/7827* (2013.01)

(58) Field of Classification Search
CPC ... H01L 21/322; H01L 21/336; H01L 21/337; H01L 29/24; H01L 29/12; H01L 29/78; H01L 29/80; H01L 29/808; H01L 29/872
USPC ........................................... 257/77, 461–468
See application file for complete search history.

(56) References Cited

U.S. PATENT DOCUMENTS

| | | | |
|---|---|---|---|
| 6,313,482 B1 * | 11/2001 | Baliga ............................. | 257/77 |
| 2009/0220788 A1 * | 9/2009 | Barrett et al. ................. | 428/402 |
| 2009/0256162 A1 * | 10/2009 | Jenny et al. ..................... | 257/77 |

(Continued)

FOREIGN PATENT DOCUMENTS

| | | |
|---|---|---|
| JP | 2008109150 A | 5/2008 |
| JP | 2010062168 A | 3/2010 |
| WO | 9504171 A1 | 2/1995 |

OTHER PUBLICATIONS

Tan et al. High-Voltage Accumulation-Layer UMOSFET's in 4H-SiC. IEEE Electron Device Letters, vol. 19, No. 12 (Dec. 1998).*

(Continued)

*Primary Examiner* — Matthew Landau
*Assistant Examiner* — Eric Ashbahian
(74) *Attorney, Agent, or Firm* — Murphy, Bilak & Homiller, PLLC (57) ABSTRACT

A silicon carbide device includes an epitaxial silicon carbide layer having a first conductivity type and a buried lateral silicon carbide edge termination region within the epitaxial silicon carbide layer and having a second conductivity type. The buried lateral silicon carbide edge termination region is covered by a silicon carbide surface layer including a doping of ions of a transition metal or including an increased density of intrinsic point defects in comparison to a density of intrinsic point defects of the buried lateral silicon carbide edge termination region.

22 Claims, 4 Drawing Sheets

(56) References Cited

U.S. PATENT DOCUMENTS

| | | | |
|---|---|---|---|
| 2010/0044825 A1* | 2/2010 | Schmidt | 257/493 |
| 2012/0122305 A1* | 5/2012 | Zhang et al. | 438/526 |
| 2013/0062624 A1* | 3/2013 | Tsuchiya et al. | 257/77 |
| 2013/0062723 A1* | 3/2013 | Henning et al. | 257/484 |
| 2014/0070230 A1* | 3/2014 | O'Loughlin | H01L 29/1608 257/77 |

OTHER PUBLICATIONS

Hatayama et al. Vanadium Ion Implanted Guard Rings for High-Voltage 4H-SiC Schottky Rectifiers. Jpn. J. Appl. Phys. vol. 39, pp. L1216-L1218 (2000).*

Online definition of edge from Merriam-Webster Dictionary.com.*

Online definition of termination from Merriam-Webster Dictionary.com.*

Hatayama, et al. "Vanadium Ion Implanted Gaurd Rings for High-Voltage 4H-SiC Schottky Rectifiers." Japanese Journal of Applied Physics, vol. 39, Part 2, No. 12A. The Japan Society of Applied Physics, Dec. 2000. pp. L1216-L1218.

Zhang, et al. "Semi-insulating SiC formed by Vanadium ion implantation." IEEE International Conference on Electron Devices and Solid-State Circuits (EDSSC), 2008. IEEE, Dec. 2008. pp. 1-6.

Kimoto, et al. "Formation of semi-insulating 6H-SiC layers by vanadium ion implantations." Applied Physics Letters, vol. 69, No. 8. American Institute of Physics, Aug. 1996. pp. 1113-1115.

* cited by examiner

SILICON CARBIDE DEVICE AND A METHOD FOR MANUFACTURING A SILICON CARBIDE DEVICE

TECHNICAL FIELD

Embodiments relate to silicon carbide technologies, and in particular to a silicon carbide device and a method for manufacturing a silicon carbide device.

BACKGROUND

Silicon carbide devices comprise a high breakdown field strength, which is similarly high as the maximal tolerable field strength in thermally grown silicon dioxide, due to the large band gap. At the semiconductor surface of silicon carbide devices (e.g. at the edge termination), very high electrical fields can occur, which represent high stress at least for the passivation layers.

Therefore, an edge termination taking into account high electric fields is important for the breakdown behavior and the long-term reliability of silicon carbide devices.

SUMMARY

A silicon carbide device according to an embodiment comprises an epitaxial silicon carbide layer comprising a first conductivity type and a buried lateral silicon carbide edge termination region within the epitaxial silicon carbide layer and comprising a second conductivity type. The buried lateral silicon carbide edge termination region is covered by a silicon carbide surface layer comprising a doping of ions of a transition metal or comprising an increased density of intrinsic point defects in comparison to a density of intrinsic point defects of the buried lateral silicon carbide edge termination region.

Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. The silicon carbide surface layer may provide a semi-insulating zone. For example, the silicon carbide surface layer comprises significantly less charge carriers for enabling the oxidation process due to the transition metal doping or the increased density of intrinsic point defects. In this way, a high temperature stability and/or moisture resistance may be achieved resulting in an improved breakdown behavior and/or an improved long-term reliability. Further, the electrical field at the surface of the silicon carbide device towards the edge can be reduced due to the silicon carbide surface layer.

In some embodiments, the transition metal comprises an energy level within the band gap of the silicon carbide of the epitaxial silicon carbide layer. Further, the energy level is located closer to the middle of the band gap than to an edge of the band gap. Dopants resulting in such deep energy levels (e.g. high necessary activation energy) may provide only few or no charge carriers in the application temperature range of the device by thermal emission. Therefore, less charge carriers for the enabling of the degradation process may be provided.

Further, in some embodiments, the increased density of intrinsic point defects is caused by an increased density of carbon vacancy defects. Layers with such defects may provide only few or no charge carriers. Therefore, less charge carriers for the enabling of the degradation process may be provided.

Some embodiments relate to a method for manufacturing a silicon carbide device, the method comprising forming a buried lateral silicon carbide edge termination region within an epitaxial silicon carbide layer. The epitaxial silicon carbide layer comprises a first conductivity type and the buried lateral silicon carbide edge termination region comprises a second conductivity type. The method further comprises forming a silicon carbide surface layer comprising a doping of ions of a transition metal or comprising an increased density of intrinsic point defects in comparison to a density of intrinsic point defects of the buried lateral silicon carbide edge termination region, so that the buried lateral silicon carbide edge termination region is covered by a silicon carbide surface layer.

The proposed method enables the manufacturing of a buried edge termination. Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. The silicon carbide surface layer may provide a semi-insulating zone. For example, the silicon carbide surface layer comprises significantly less charge carriers for the enabling of the degradation process due to the transition metal doping or the increased density of intrinsic point defects. In this way, a high temperature stability and/or moisture resistance can be achieved resulting in an improved breakdown behavior and/or an improved long-term reliability. Further, the electrical field at the surface of the silicon carbide device can be reduced due to the silicon carbide surface layer.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
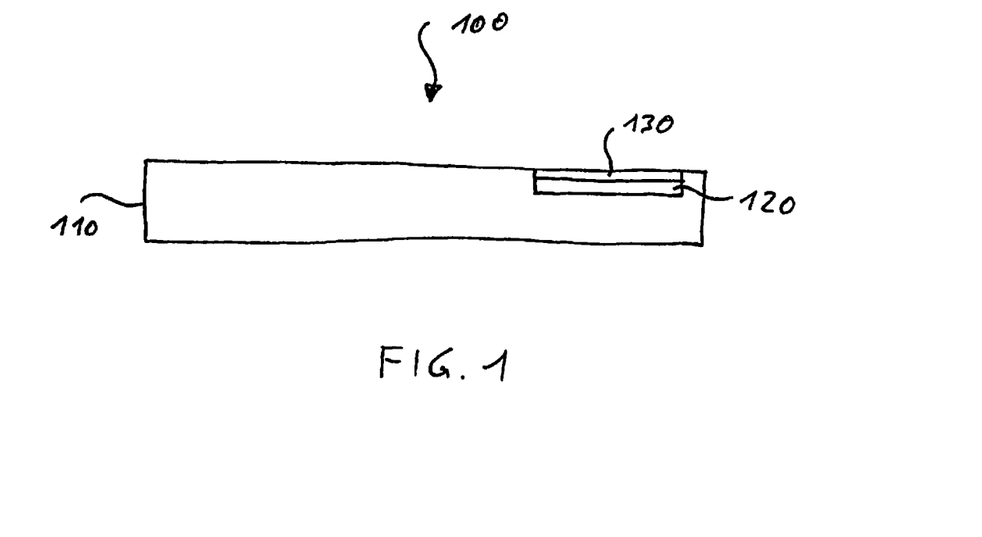
FIG. 1 shows a schematic illustration of a cross-section of a silicon carbide device.

FIG. 1 shows a schematic illustration of a cross-section of a silicon carbide device 100 according to an embodiment. The silicon carbide device 100 comprises an epitaxial silicon carbide layer 110 comprising a first conductivity type (e.g. caused by ions of a main group element of the third or the fifth main group of the periodic table), and a buried lateral silicon carbide edge termination region 120 located within the epitaxial silicon carbide layer 110 and comprising a second conductivity type (e.g. caused by ions of a main group element of the third or the fifth main group of the periodic table). Further, the buried lateral silicon carbide edge termination region 120 is covered by a silicon carbide surface layer 130 comprising a doping of ions of a transition metal or comprising an increased density of intrinsic point defects in comparison to a density of intrinsic point defects of the buried lateral silicon carbide edge termination region 120.

Due to the buried lateral silicon carbide edge termination region 120, the electric field in an operating state is reduced toward the edge of the silicon carbide device so that the breakdown behavior can be improved. Further, an oxidation of the buried lateral silicon carbide edge termination region 120 can be avoided by covering the buried lateral silicon carbide edge termination region 120 with the silicon carbide surface layer 130. Additionally, an oxidation of the silicon carbide surface layer 130 may be avoided. The silicon carbide surface layer 130 may provide an electrically semi-insulating zone. For example, the silicon carbide surface layer 130 comprises significantly less charge carriers for the enabling of the degradation process due to the transition metal doping or the increased density of intrinsic point defects. In this way, the breakdown behavior and/or the long-time reliability can be significantly improved. Further, the electrical field at the surface of the silicon carbide device 100 can be reduced due to the silicon carbide surface layer 130.

The epitaxial silicon carbide layer 110 may be epitaxially grown on a silicon carbide substrate, may be bonded or attached to a carrier substrate, or may be provided without substrate.

The epitaxial silicon carbide layer 110 has a first conductivity type which can be a p-doping (e.g. caused by incorporating aluminum ions or boron ions during epitaxy process) or an n-doping (e.g. caused by incorporating nitrogen ions, phosphor ions or arsenic ions during epitaxy process). Consequently, the second conductivity type indicates an opposite n-doping or p-doping. In other words, the first conductivity type may indicate an n-doping and the second conductivity type may indicate a p-doping or vice-versa.

The main surface of the silicon carbide device 100 may be a surface of the silicon carbide layers of the silicon carbide device 100 towards metal layers, insulation layers or passivation layers on top of the silicon carbide layers. In comparison to a basically vertical edge surface (e.g. resulting from separating the silicon carbide device from others) of the silicon carbide device 100, the main surface of the silicon carbide device 100 may be a basically horizontal surface. The main surface of the silicon carbide device 100 may be a basically even plane (e.g. neglecting unevenness of the silicon carbide layers due to the manufacturing process).

The lateral expansion or the extension of a layer may be the expansion in parallel to the main surface of the silicon carbide device 100.

In other words, the main surface of the silicon carbide device 100 may be the interface between the silicon carbide and an insulation layer, metal layer or passivation layer on top of the silicon carbide. In comparison, the edge of the silicon carbide device 100 is basically a surface orthogonal to the main surface of the silicon carbide device 100.

In view of this definition, a layer of the silicon carbide device 100 may basically expand in two lateral directions and comprises a thickness measured orthogonally to the lateral directions.

The buried lateral silicon carbide edge termination region 120 is manufactured within the epitaxial silicon carbide layer 110. The buried lateral silicon carbide edge termination region 120 extends laterally towards the edge of the silicon carbide device 100 and represents at least one part of an edge termination structure. The buried lateral silicon carbide edge termination region 120 is buried below the silicon carbide surface layer 130, which may mean that the buried lateral silicon carbide edge termination region 120 may not be exposed at the main surface of the silicon carbide device 100, for example.

The buried lateral silicon carbide edge termination region 120 may be part of a larger implant area comprising the second conductivity type within the epitaxial silicon carbide layer 110. In other words, the buried lateral silicon carbide edge termination region 120 may be a part of an implant area which is close to the edge of the silicon carbide device 100 (e.g. closer than 200 µm, closer than 100 µm, closer than 50 µm or closer than 20 µm, which may depend on the type of silicon carbide device or the die area occupied by the silicon carbide device). In other words, an implant area comprising the second conductivity type may be located within the epitaxial silicon carbide layer 110 which comprises a lateral end located close to an edge of the silicon carbide device 100 covered by the silicon carbide surface layer 130. This lateral end of the implant area may represent or form the buried lateral silicon carbide edge termination region 120. Alternatively, the buried lateral silicon carbide edge termination region 120 may be a limited implant area located in the proximity of the edge of the silicon carbide device 100 (e.g. closer than 200 µm, closer than 100 µm, closer than 50 µm or closer than 20 µm, which may depend on the type of silicon carbide device, the blocking voltage of the silicon carbide device or the die area occupied by the silicon carbide device), and being surrounded by silicon carbide comprising the first conductivity type and the silicon carbide surface layer 130 and optionally a metal layer on top of the silicon carbide (e.g. at a contact area).

The buried lateral silicon carbide edge termination region 120 is covered by the silicon carbide surface layer 130 so that the buried lateral silicon carbide edge termination region 120 is not exposed at the main surface of the silicon carbide device 100. In other words, the silicon carbide surface layer 130 is located on top of the buried lateral silicon carbide edge termination region 120 so that an exposure of the buried lateral silicon carbide edge termination region 120 at the main surface of the silicon carbide device 100 may be prevented.

In other words, the silicon carbide surface layer 130 may form a termination towards upper non-semiconductor layers of the silicon carbide device 100.

The silicon carbide surface layer 130 may be implemented in various ways. According to an example, the silicon carbide surface layer 130 may be implemented with a doping of ions of a transition metal. Various transition metals may be used. For example, the transition metal may have an energy level within the band gap of the silicon carbide of the epitaxial silicon carbide layer 110, wherein the energy level (e.g. energy level of electron holes) is located closer to the middle of the band gap than to an edge of the band gap (or less than 20% or less than 10% of the band gap away from the middle of the band gap). A defect may cause deep energy levels corresponding to the conductivity type (e.g. donor or acceptor) and leads to a highly ionized silicon carbide by accepting free charge carriers (e.g. electrons for n-type SiC, holes for p-type SiC). Beside the non-freeing or blocking of free charge carriers in the valence band or the conduction band, free charge carriers (holes or electrons) may be trapped or captured. Dopants resulting in such deep energy levels (e.g. high necessary activation energy) may provide only few or no charge carriers in the application temperature range of the device by thermal emission. For example, the transition metal may be vanadium, chromium or titanium.

Alternatively (or also additionally), the silicon carbide surface layer 130 may be implemented with an increased density of intrinsic point defects in comparison to a density of intrinsic point defects of the buried lateral silicon carbide edge termination region 120. An increased density of intrinsic point defects may be implemented in various ways. For example, the increased density of intrinsic point defects may be caused by an increased density of carbon vacancy defects. In other words, the density of missing carbon atoms within the lattice of the silicon carbide of the silicon carbide surface layer 130 may be increased compared to the density of missing carbon atoms within the lattice of the silicon carbide of the buried lateral silicon carbide edge termination region 120.

Optionally, additionally or alternatively, the silicon carbide surface layer 130 has a sheet resistance larger than $1*10^9$ Ohm per square. Such layers may provide only few or no charge carriers.

Optionally, additionally or alternatively to one or more embodiments described before, the silicon carbide surface layer 130 may extend laterally at least from a lateral end of the buried lateral silicon carbide edge termination region 120 close to the edge of the silicon carbide device 100 (e.g. the lateral end of the buried lateral silicon carbide edge termination region closer to the edge than the other end in a cross-section of the silicon carbide device) to at least a metal layer electrically connected to an active area of the silicon carbide device 100, while the active area is left out by the silicon carbide surface layer 130. In other words, the silicon carbide surface layer 130 covers the buried lateral silicon carbide edge termination region 120 close to the edge of the silicon carbide device 100, but leaves the active area open or uncovered so that the active area is exposed at a main surface of the silicon carbide device 100 or the silicon carbide material. In this way, the active area can be accessible for an upper metal layer, an insulation layer or a passivation layer (e.g. for implementing a metal contact and/or the wiring of the silicon carbide device).

An active area of the silicon carbide device 100 may be a central area on the die of the silicon carbide device 100 surrounded by an edge region. The active area of the silicon carbide device 100 may be an area of the silicon carbide device 100 for implementing the electrical functionality of the silicon carbide device 100. The width of the edge region may depend on the blocking voltage, the functionality and/or the die size of the silicon carbide device 100.

Further optionally, alternatively or additionally to one or more embodiments described above, the buried lateral silicon carbide edge termination region 120 may laterally end with a predefined distance to the edge of the silicon carbide device so that at least a lateral end located close to the edge of the silicon carbide device is (e.g. completely) surrounded by silicon carbide with the first conductivity type and the silicon carbide surface layer 130 and optionally a metal layer on top of the silicon carbide (e.g. at a contact area). In other words, an exposure of the buried lateral silicon carbide edge termination region 120 at the edge of the silicon carbide device 100 may be avoided in the lateral direction towards the edge of the silicon carbide device 100 by implementing the buried lateral silicon carbide edge termination region 120 with a predefined lateral distance to the edge of the silicon carbide device 100. In this way, the buried lateral silicon carbide edge termination region 120 may be completely surrounded by the silicon carbide surface layer 130 and the epitaxial silicon carbide layer 110 and optionally a metal layer on top of the silicon carbide so that the buried lateral silicon carbide edge termination region 120 can be protected against environmental damages. The predefined distance to the edge of the silicon carbide device 100 may vary in dependency on the size and functionality of the silicon carbide device 100. For example, the predefined distance may be between 5 µm and 200 µm, 5 µm and 50 µm or 10 µm and 30 µm.

The buried lateral silicon carbide edge termination region 120 can be implemented or manufactured in different ways. For example, the buried lateral silicon carbide edge termination region 120 may be manufacturable, generated or manufactured by a high energy implant through the surface into a deep region (e.g. compared to a surface region exposed at the surface) of the epitaxial silicon carbide layer 110 (e.g. through a part of the surface of the silicon carbide device determined by an implant mask used for masking the implant), so that an implant area is formed within the epitaxial silicon carbide layer 110 at a depth and with a thickness depending on an energy distribution of the ions used for the implant. In other words, the silicon carbide surface layer 130 may be part of the epitaxial silicon carbide layer 110 (e.g. as indicated in FIG. 1) and the buried lateral silicon carbide edge termination region 120 may be an implant region manufactured by implanting ions of the second conductivity type into the epitaxial silicon carbide layer 110 through a surface region of the epitaxial silicon carbide layer 110 used for the silicon carbide surface layer 130. In this way, the buried lateral silicon carbide edge termination region 120 can be implemented with low effort and a low number of manufacturing steps.

Alternatively, the buried lateral silicon carbide edge termination region 120 may be manufacturable, generated or manufactured by implanting ions into a surface region of the epitaxial silicon carbide layer 110 and depositing the silicon carbide surface layer 130 epitaxially on top of the epitaxial silicon carbide layer 110. The surface region may be a part of the epitaxial silicon carbide layer 110 located at the surface of the epitaxial silicon carbide layer 110. In other words, the silicon carbide surface layer 130 may be an epitaxial layer deposited on top of the epitaxial silicon carbide layer 110 with the buried lateral silicon carbide edge termination region 120. In this way, a smearing of the implant area at the edge of the buried lateral silicon carbide edge termination region 120 (e.g. due to the impact of the edge profile of the implantation mask) can be avoided and/or the thickness of the silicon carbide surface layer 130 can be varied in a large range.

For example, the silicon carbide surface layer 130 can be manufacturable generated or manufactured by depositing an n-doped epitaxial layer and implanting a transition metal or by depositing a transition metal doped epitaxial layer. In other words, transition metal dopants may be placed or inserted into the silicon carbide surface layer 130 already during the epitaxial deposition of the layer or afterwards by implanting transition metal ions.

Optionally, the implant of the transition metal ions or the epitaxial growth of the transition metal doped layer may be done as long as the surface is still planar (e.g. before other layers are manufactured on top of the surface of the silicon carbide).

Optionally, additionally or alternatively to one or more embodiments described above, the buried lateral silicon carbide edge termination region 120 can be implemented with a variation of lateral doping. In other words, the buried lateral silicon carbide edge termination region 120 may comprise a varying lateral doping concentration. The varying doping concentration may decrease towards the edge of the silicon carbide device 100. The decreasing doping concentration may be implemented in steps or continuously. In other words, the buried lateral silicon carbide edge termination region 120 may comprise a first area with a first doping concentration and a second area with a second doping concentration, wherein the first area is closer to the edge of the silicon carbide device 100 than the second area and the first doping concentration is lower than the second doping concentration. In this way, the electrical field strength towards the edge of the silicon carbide device 100 can be further reduced resulting in an improved breakdown behavior and/or long-time reliability.

Optionally, alternatively or additionally to one or more embodiments described above, the buried lateral silicon carbide edge termination region 120 may surround the active area of the silicon carbide device 100 (e.g. in a topside view or laterally or along the edges of the silicon carbide device). In other words, the buried lateral silicon carbide edge termination region 120 may be located within an edge region (e.g. extending 5 µm and 500 µm, between 10 µm and 500 µm, between 15 µm and 200 µm or between 50 µm and 200 µm from the edge towards a center of the silicon carbide device) of the silicon carbide device 100 surrounding the active area of the silicon carbide device 100. In this way, the electrical field strength can be kept low along the whole edge of the silicon carbide device 100. Alternatively, the buried lateral silicon carbide edge termination region 120 may only be implemented along regions of the edge comprising high electrical fields in an operating state of the silicon carbide device 100.

For example, the buried lateral silicon carbide edge termination region 120 may have a thickness between 200 nm and 5 µm (or between 400 nm and 2 µm, between 500 nm and 1 µm or between 600 nm and 800 nm). In other words, the thickness of the buried lateral silicon carbide edge termination region 120 can be selected within a wide range and may be determined based on the desired functionality (e.g. diode, transistor) of the silicon carbide device.

The thickness of a layer may be an average thickness, since the thickness of a layer may slightly vary e.g. due to manufacturing tolerances. For example, the thickness of the buried lateral silicon carbide edge termination region 120 may be measured between a border towards the silicon carbide surface layer 130 and the p-n-junction at the opposite side of the buried lateral silicon carbide edge termination region 120 towards the epitaxial silicon carbide layer 110. The border towards the silicon carbide surface layer 130 may be a zone corresponding to a transition of a doping concentration of the transition metal ions being higher than a doping concentration of the dopant of the buried lateral silicon carbide edge termination region 120 to a doping concentration of the transition metal ions being lower than a doping concentration of the dopant of the buried lateral silicon carbide edge termination region 120.

Similarly, a thickness of the silicon carbide surface layer 130 may be measured between the border to the buried lateral silicon carbide edge termination region 120 and the opposite (e.g. exposed) surface of the silicon carbide surface layer 130. For example, the silicon carbide surface layer may have a thickness between 20 nm and 2 µm (or between 50 nm and 200 nm, between 50 nm and 1500 nm, between 200 nm and 1000 nm or between 600 nm and 1 µm).

As mentioned, the thickness of the buried lateral silicon carbide edge termination region 120 and the silicon carbide surface layer 130 may vary in a large range depending on the type of silicon carbide device 100, the blocking voltage of the silicon carbide device 100 and/or the die area occupied by the silicon carbide device 100, for example. In some embodiments, it may be sufficient to cover the buried lateral silicon carbide edge termination region 120 by a relatively thin silicon carbide surface layer 130. For example, a thickness of the buried lateral silicon carbide edge termination region 120 may be larger than a thickness of the silicon carbide surface layer 130.

Optionally, additionally or alternatively to one or more embodiments described above, a plurality of buried lateral silicon carbide edge termination regions may be manufactured (e.g. p-rings, ring-shaped regions, point-shaped, sawtooth-shaped, wavelike regions). In this way, the breakdown behavior and/or the long-term reliability of the silicon carbide device 100 may be improved.

Figure 2:
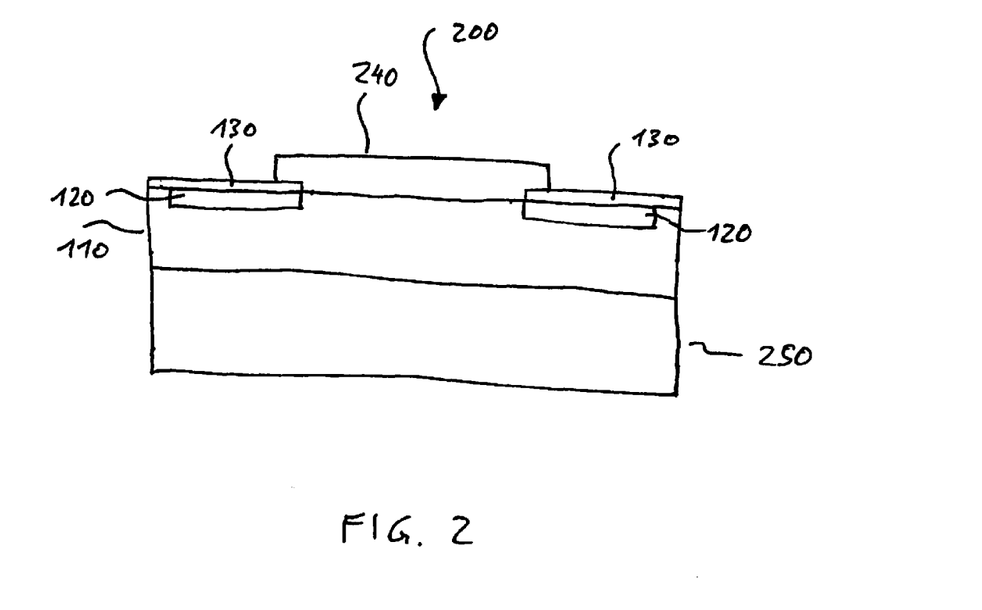
FIG. 2 shows a schematic illustration of a cross-section of a further silicon carbide device.

FIG. 2 shows a schematic illustration of a silicon carbide device 200 according to another embodiment. The basic structure is similar to the structure shown in FIG. 1. However, in this case, the buried lateral silicon carbide edge termination region 120 surrounds the silicon carbide device 200 and occurs therefore at both edges of the silicon carbide device 200 shown in the illustrated cross section.

Further, the silicon carbide device 200 comprises a metal contact 240 on top of the active area (e.g. on top of the epitaxial silicon carbide layer) of the silicon carbide device 200. In this way, a silicon carbide Schottky diode can be implemented, for example. Exemplarily, the epitaxial silicon carbide layer 110 and the silicon carbide surface layer 130 may have an n-doping and the buried lateral silicon carbide edge termination region 120 may have a vanadium doping. The buried lateral silicon carbide edge termination region 120 may surround the active area of the silicon carbide device 100 (e.g. in a top view of the silicon carbide device). Further, the silicon carbide surface layer 130 may extend from an edge of the silicon carbide device 200 along the buried lateral silicon carbide edge termination region 120 to the edge of the buried lateral silicon carbide edge termination region 120 opposite to the end at the edge of the silicon carbide device 200, or at least to the edge of the metal contact 240. Consequently, also the silicon carbide surface layer 130 surrounds the active area of the silicon carbide device 200 and leaves open the active area for the connection to the metal contact 240. In this example, the epitaxial silicon carbide layer 110 represents an n-drift layer which is arranged on top of a silicon carbide substrate 250.

Figure 3:
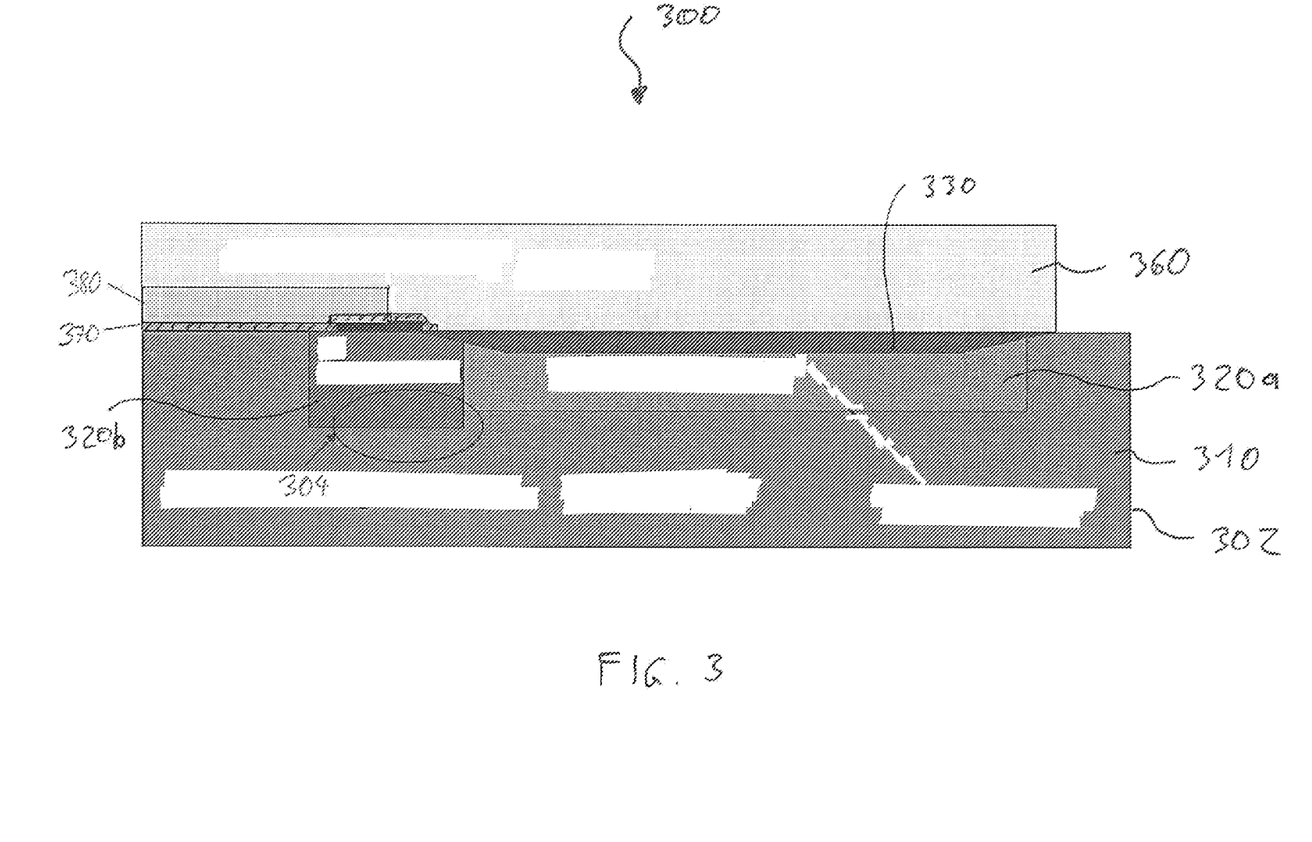
FIG. 3 shows a schematic illustration of a cross-section of an edge region of a silicon carbide device.

FIG. 3 shows a schematic illustration of a silicon carbide edge termination with a buried p-region according to an embodiment. The silicon carbide edge termination represents an edge region of a silicon carbide device 300. The silicon carbide device 300 comprises an n-doped silicon carbide drift layer 310 adjusted to the particular silicon carbide device 300 (e.g. Schottky diode, merged pin Schottky diode, p-n diode, bipolar transistor, field effect transistor, metal oxide semiconductor transistor or junction gate field effect transistor) and/or the voltage class of the silicon carbide device 300. The epitaxial silicon carbide layer 310 comprises a p-doped silicon carbide region 320 (e.g. comprising a lightly doped p⁻ implant region 320a close to the edge and a highly doped p⁺ implant area 320b close to the metal contact or layer) for the edge termination representing a buried lateral silicon carbide edge termination region. The buried lateral silicon carbide edge termination region 320 is covered by a vanadium-doped silicon carbide layer 330 (e.g. vanadium implant zone) representing a silicon carbide surface layer. The silicon carbide surface layer 330 is exposed at the main surface of the silicon carbide device 300. Optionally, a contact layer (e.g. NiAl, nickel aluminum) is implemented on top of the highly doped p⁺ implant area 320b in order to enable an ohmic contact between a metal layer or contact and the buried lateral silicon carbide edge termination region. Further, a barrier layer 370 (e.g. titanium) may be located between a metal contact or metal layer or power metal 380 (e.g. aluminum) and a contact area of the active area of the n-doped silicon carbide drift layer 310. A passivation layer 360 (e.g. polyimide) is provided on top of the silicon carbide surface layer 330. The buried lateral silicon carbide edge termination region 320 laterally ends with a predefined distance to the edge 302 of the silicon carbide device 300. The buried lateral silicon carbide edge termination region 320 may be part of a larger implant area extending further towards the active chip area (or active area of the silicon carbide device). The silicon carbide surface layer 330 laterally ends with a predefined distance (e.g. less than the predefined distance of the buried lateral silicon carbide edge termination region as shown in FIG. 3) to the edge 302 of the silicon carbide devices 300, extends to the edge 302 of the silicon carbide device, or ends at the same predefined distance to the edge 302 of the silicon carbide device 300 as the buried lateral silicon carbide edge termination region 320. In this example, the buried lateral silicon carbide edge termination region 320 has a larger thickness than the silicon carbide surface layer 330. In the shown example, the highest field 304 may occur in the region of the highly doped p⁺ implant area 320b as indicated by the encircled area.

The embodiment shown in FIG. 3 may illustrate a modified edge with implanted deep impurities (e.g. energy level close to the middle of the band gap) implemented by vanadium, for example. FIG. 3 illustrates a position or an alignment of a semi-insulating zone (silicon carbide surface layer), for example.

The edge termination shown in FIG. 3 may comprise one or more optional, additional features corresponding to one or more aspects mentioned above.

In general, the doping concentrations of the epitaxial silicon carbide layer 110, the buried lateral silicon carbide edge termination region 120 and/or the silicon carbide surface layer 130 may vary in a large range. For example, the silicon carbide surface layer 130 comprises a higher average or maximal transition metal doping concentration than an average or maximal doping concentration of the epitaxial silicon carbide layer 110.

Figure 4:
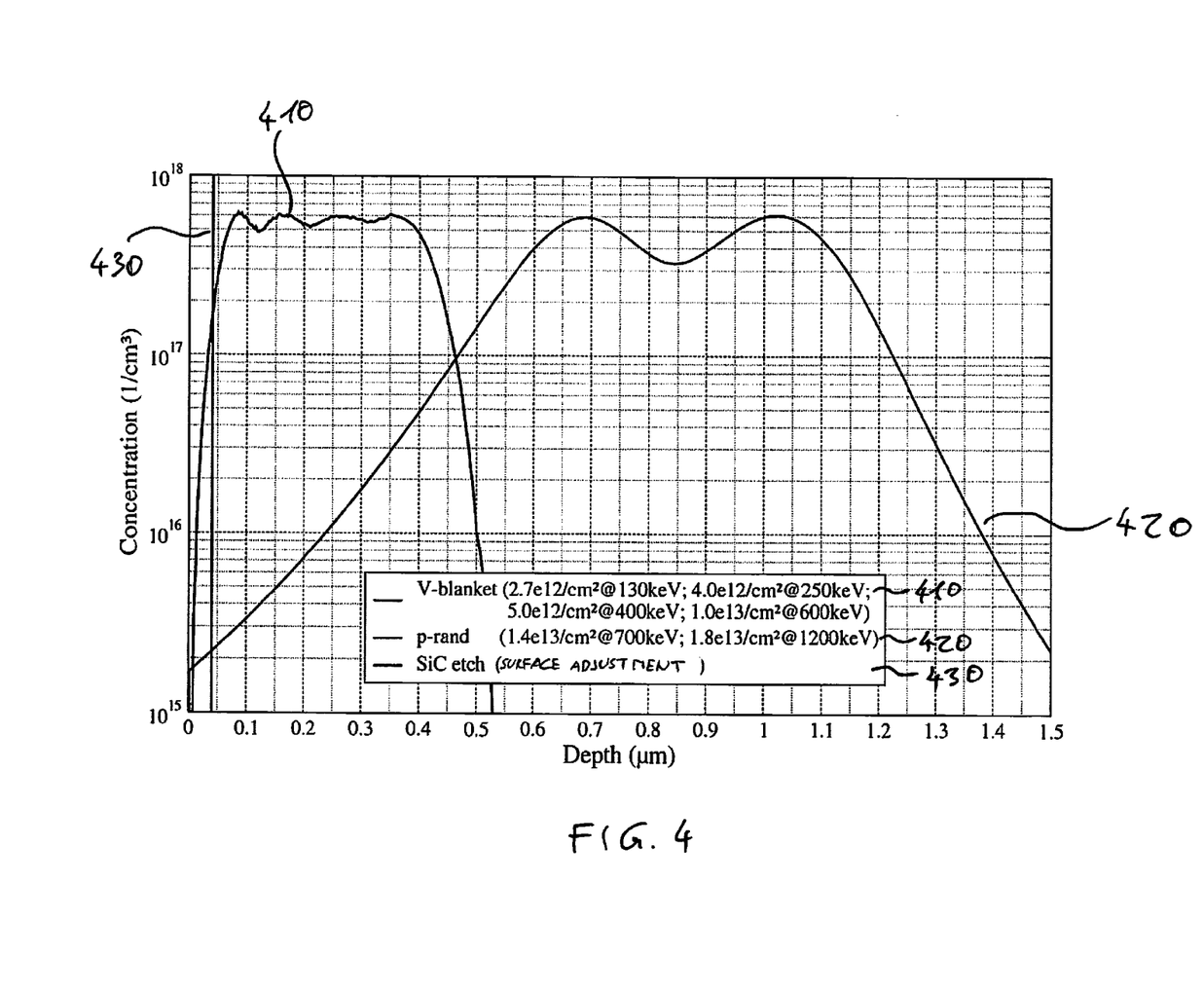
FIG. 4 shows vanadium and aluminum implant profiles.

FIG. 4 shows an example of a vanadium implant profile 410 (e.g. with 4 energies) and an aluminum implant profile 420 for the p-region (e.g. two energies), which may be used for manufacturing semi-insulating silicon carbide (representing the silicon carbide surface layer) at the surface. The diagram shows the concentration of dopants ($1/cm^3$) over the depth (μm) within the silicon carbide. In this example, the vanadium blanket implant and the p-edge implant are done with the indicated concentrations and implant energies. The epitaxial silicon carbide layer 110 may comprise a basis doping of $1.5e16/cm^2$, for example. Afterwards, the silicon carbide surface may be optionally etched back for surface adjustment 430 in order to provide a Schottky contact for a following metal layer. With such an implant profile, a surge current stable (SCS) 650V silicon carbide device may be manufactured.

The electron hole concentration of an edge termination with p-rings and vanadium implant can be simulated. Such a simulation can show that a significant reduction of the surface near hole concentration can be obtained due to the vanadium implant.

Some embodiments relate to a silicon carbide device comprising an n-doping and a buried lateral silicon carbide edge termination region located within the epitaxial silicon carbide layer comprising a p-doping. The buried lateral silicon carbide edge termination region is covered by a silicon carbide surface layer comprising a sheet resistance larger than $1*10^9$ Ohm per square (or more than $5*10^9$ Ohm or more than $1*10^{10}$ Ohm per square).

The silicon carbide device may comprise one or more additional optional features corresponding to one or more aspects described above.

In some embodiments, the silicon carbide device comprises a Schottky diode, a merged pin Schottky diode, a p-n diode, a bipolar transistor, a field effect transistor, a metal oxide semiconductor transistor or a junction gate field effect transistor. In other words, the silicon carbide device may be a Schottky diode, a merged pin Schottky diode, a p-n diode, a bipolar transistor, a field effect transistor, a metal oxide semiconductor transistor or a junction gate field effect transistor or an electrical circuit comprising one or more of these elements.

Some embodiments relate to a silicon carbide device configured to handle voltages up to 500V, up to 1000V, up to 1500V or more. Such silicon carbide devices may also be called power devices.

Figure 5:
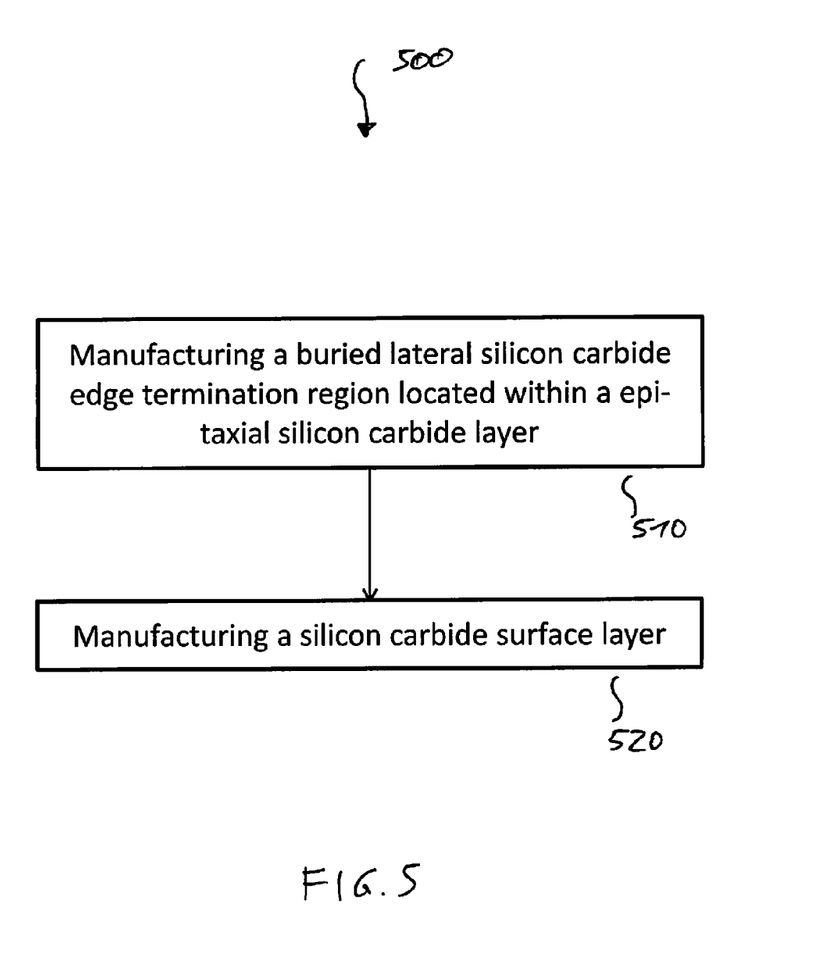
FIG. 5 shows a flowchart of a method for manufacturing a silicon carbide device.

FIG. 5 shows a flow diagram of a method 500 for manufacturing a silicon carbide device according to an embodiment. The method 500 comprises manufacturing a buried lateral silicon carbide edge termination region located within an epitaxial silicon carbide layer (510). The epitaxial silicon carbide layer has a first conductivity type and the buried lateral silicon carbide edge termination region has a second conductivity type. The method 500 further comprises manufacturing a silicon carbide surface layer comprising a doping of ions of a transition metal or comprising an increased density of intrinsic point defects in comparison to a density of intrinsic point defects of the buried lateral silicon carbide edge termination region, so that it is covered by a silicon carbide surface layer (520).

In this way, a silicon carbide device with the properties and characteristics described above can be manufactured with low effort.

The epitaxial silicon carbide layer may only be the supplied with the semiconductor material or may be additionally manufactured first (e.g. on top of a silicon carbide substrate).

The buried lateral silicon carbide edge termination region below the silicon carbide surface layer may be manufactured in different ways. For example, the manufacturing of the buried lateral silicon carbide edge termination region may comprise implanting ions of the second conductivity type into the epitaxial silicon carbide layer through a surface region of the epitaxial silicon carbide layer (e.g. through a part of the surface of the silicon carbide device determined by an implant mask used for masking the implant) used for manufacturing the silicon carbide surface layer so that the buried lateral silicon carbide edge termination region is covered by the silicon carbide surface layer of the epitaxial silicon carbide layer. In other words, the buried lateral silicon carbide edge termination region may be manufactured by a high-energy ion implant into the depth of the epitaxial silicon carbide layer so that a thin epitaxial silicon carbide layer comprising the first conductivity type remains on top of the implant region. This remaining layer forms the silicon carbide surface layer. For example, ions with an average energy of more than 50 keV, more than 100 keV or more than 200 keV may be used for manufacturing the buried lateral silicon carbide edge termination region within the epitaxial silicon carbide layer. Further, the energy distribution of the ions can be selected so that the doping concentration varies with the depth in a predefined manner. For example, the doping concentration may increase with the depth to a maximum and may decrease afterwards. Alternatively, the basically constant doping concentration may be manufactured (e.g. neglecting edge effects and neglecting deviation of less than 20%, 10% or 5%) resulting basically a box or rectangular distribution. In still other words, the buried lateral silicon carbide edge termination region may be manufactured by implanting ions of the second conductivity type into a deep region of the epitaxial silicon carbide layer and the silicon carbide surface layer may be manufactured by implanting transition metal ions into a shallow surface region of the epitaxial silicon carbide layer, so that the silicon carbide surface layer is obtained on top of the buried lateral silicon carbide edge termination region.

The transition metal ions can be implanted with lower energy (e.g. average or maximal energy) than the buried lateral silicon carbide edge termination region so that a thin layer exposed at the surface of the epitaxial silicon carbide layer is converted to the silicon carbide surface layer comprising the transition metal doping. In other words, after implanting ions of the second conductivity type into a deep surface region (e.g. compared to a surface region of the silicon carbide surface layer) of the epitaxial silicon carbide layer, transition metal ions can be implanted into a shallow surface region (e.g. thinner than the deep surface region of the buried lateral silicon carbide edge termination region) of the epitaxial silicon carbide layer so that the silicon carbide surface layer is obtained on top of the buried lateral silicon carbide edge termination region. The transition metal ions may be implanted in the shallow surface region with a doping concentration higher than a (e.g. maximal or average) doping concentration of the epitaxial silicon carbide layer in the shallow surface region before the implant of the ions. In this way, a buried edge termination region can be obtained without an additional epitaxial process. Therefore, a reliable edge termination can be obtained with low effort.

For example, a p-implantation (e.g. deeper and optionally by omitting the lowest or both lowest energies of a three-step implant) is performed, followed by masking of the areas not designated for a vanadium implant with a hard mask (e.g. additionally with an adjustment of the hard mask edge angle for a better field distribution). Then, a vanadium implant followed by annealing the implant areas at a temperature of more than 1400, more than 1500, more than 1600 or more than 1650° C. (e.g. with a carbon cover layer) is performed.

Alternatively, the buried lateral silicon carbide edge termination region may be manufactured by implanting ions of the second conductivity type into a surface region of the epitaxial silicon carbide layer so that the buried lateral silicon carbide edge termination layer is exposed at the surface of the epitaxial silicon carbide layer. Further, the silicon carbide surface layer may be manufactured on top of the epitaxial silicon carbide layer so that the buried lateral silicon carbide edge termination region is covered by the silicon carbide surface layer. In other words, the buried lateral silicon carbide edge termination region may be implanted with low energy ions resulting in an implant area located at or near the surface of the epitaxial silicon carbide layer. Afterwards, the buried lateral silicon carbide edge termination region is buried by depositing the silicon carbide surface layer.

In this way, a smearing of the implanted ions at the edge of the buried lateral silicon carbide edge termination region into the silicon carbide surface layer can be avoided. Further, the silicon carbide surface layer can be implemented with almost arbitrary thickness. Further, the doping concentration of the silicon carbide surface layer can be selected in a wide range.

The deposited silicon carbide surface layer may be manufactured by depositing an n-doped epitaxial layer and implanting the transition metal or by depositing a transition metal doped epitaxial layer, for example.

Optionally, the implant of the transition metal ions or the epitaxial growth of the transition metal doped layer may be done as long as the surface is still planar (e.g. before other layers are manufactured on top of the surface of the silicon carbide).

For example, a p-implantation is performed, followed by depositing or growing an n-doped epitaxial layer with a thickness of the desired semi-insulating layer. Then, vanadium is implanted in an edge region with a depth so that the vanadium doping directly (without an n-interlayer) joins the p-doped area. Optionally, the non-implanted areas (anode area) are etched back.

Alternatively, a p-implantation is performed, followed by depositing or growing a vanadium-doped epitaxial layer, for example. Further, the epitaxial layer may be etched back in the anode region in order to connect the n-region by a Schottky contact.

Alternatively or additionally, the silicon carbide surface layer may comprise an increased density of intrinsic point defects that may be manufactured by implantation of silicon to move the stochiometry to a Si-rich environment favoring C-vacancies as deep level point defect. Alternatively, an electron irradiation with a low energy (e.g. 170 keV) which is enough to create C-vacancies but not enough to generate Si-vacancies may be used. In both cases, the point defect density may be in the same order of magnitude as the doping level of the layer (~10e16 cm-3), for example.

Optionally, alternatively or additionally, the method 500 may further comprise removing the silicon carbide surface layer (e.g. if it is deposited throughout the whole surface of the silicon carbide device) at an active area of the silicon carbide device. In this way, the active area may be accessible for further implants for electrical structures used for the electrical functionality of the silicon carbide device or for connecting one or more areas within the active area of the silicon carbide device to a metal contact or a metal layer above or on top of the silicon carbide die.

The proposed method may be used for manufacturing all kinds of semiconductor devices mentioned above. Consequently, the embodiments described above are applicable or implementable in connection with the method for manufacturing such a silicon carbide device.

Further, the method 500 may comprise one or more optional, additional or alternative steps corresponding to one or more embodiments described above.

Some embodiments relate to an edge termination for silicon carbide devices (SiC devices) with improved moisture robustness by vanadium implant, for example.

For example, a corrosion of the silicon carbide device may occur in outdoor applications (e.g. solar) due to moisture. The corrosion mechanism at the SiC high voltage edge under moisture stress may start with a dewing on the silica gel causing a humidity saturation in the polyimide edge protection. Consequently, a water dissociation in a high electric field may occur, which may cause a propagation of OH$^-$ ions to the SiC surface and a recombination with holes. In this way, oxygen radicals may be formed on the SiC interface causing a local oxidation and volume increase resulting in a partial imide delamination. Afterwards a supersaturation of humidity in the imide due to a temperature swing and a precipitation at the imide-SiC gap may occur causing an accelerated anodic oxidation of the p-SiC (p doped silicon carbide) edge termination and a reduction of the blocking voltage, for example.

The vanadium implant (or another mentioned silicon carbide surface layer) may protect the silicon carbide device against this destructive effect.

The corrosion process may be suppressed, because no or only few charge carriers may be available for a charge exchange with dissociation products of the water at the surface.

According to the proposed concept or an embodiment, the availability of free charge carriers at the SiC surface may be suppressed in the region of the edge termination by implanting of a dopant establishing or providing a deep impurity close to the center of the band of the SiC. In this way, a charge exchange of the OH$^-$ ions can be suppressed so that no or less oxygen radical are produced and no or less edge oxidation occurs.

For example, vanadium may be used for manufacturing a so-called semi-insulating SiC (i.e. with very high sheet resistance up to 1e10 Ohm per square). A proposed charge carrier free layer may be provided or implemented by using vanadium, for example.

Depending on the implant energy, semi-insulating layers with a thickness up to 1 µm or more may be manufacturable or manufactured with a bipolar edge termination located below, for example. In this way, the edge at the surface may be free of charge carriers independent from an applied external voltage. In order to manufacture such an edge, it may be ensured by a masked implant that all p-regions at the edge are covered and that the vanadium dose enables a secure compensation of the p-doping concentration.

The proposed concept and methods may also be applicable to other vertical SiC power devices. In some embodiments, the implant acts or the epitaxial growth of the vanadium doped layer may be done as long as the surface is still planar (e.g. at the manufacturing of the trench structures).

The vanadium implanted area may end beneath the later power metal, for example.

Beside vanadium, there are also other possible dopants providing levels close to mid-band. (e.g. other transition metals like titanium).

Further, it is possible to generate intrinsic point defects (e.g. carbon vacancy defects) within the SiC, which also lead to a high compensation and may provide nearly a semi-insulating behavior.

In comparison to silicon carbide edge terminations which are based on the principle of bipolar junction terminations or variation of lateral doping, a degradation of the p-doped silicon carbide region at the interface to the passivation layer subject to certain conditions (e.g. high moisture or temperature variation) and normal electrical load can be avoided by the described concept. Especially a degradation which occurs by an oxidation of the silicon carbide in the p-doped edge region (anodic oxidation) can be avoided. In this way, the doping amount inserted at the edge for the electric field control can be protected from being consumed (by the oxidation) which may result in a destructive breakdown at voltages below the nominal voltage of the device. Also the risk of a crack formation, a low tightness against water, a critical process compatibility and/or vulnerability to the integration of mobile ions resulting in a breakdown voltage drift as it may occur in connection with oxide or nitride coating can be reduced or avoided by using the proposed concept.

The edge termination of such silicon carbide devices can be configured so that a transition metal-doped region is formed at the surface of the edge termination (e.g. especially in the region, in which an increased electrical field strength occurs) to avoid the mentioned degradation effects.

For example, a possible method is the dimensioning of a bipolar junction termination so that the used p-doped region is buried below the silicon carbide surface. Especially at silicon carbide based devices, this can be implemented by implanting the atoms operative as acceptors with an implant energy that causes an end of range which is located at a sufficient distance to the surface. The proposed scheme can easily be implemented since the dopants possible as acceptors virtually do not diffuse in silicon carbide. In comparison, for example silicon comprises a high diffusion constant for possible acceptor materials.

The implantation energies may lie above 50 keV, above 100 keV or above 200 keV, for example. Also an implementation with several energies and different doses may be possible for such an edge termination to improve the effectiveness. For example, the dose may first increase with depth and then decrease again. Alternatively, the dose may also decrease with depth.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A silicon carbide device, comprising:
an epitaxial silicon carbide layer comprising a first conductivity type; and
a buried lateral silicon carbide edge termination region located within the epitaxial silicon carbide layer comprising a second conductivity type,
wherein the buried lateral silicon carbide edge termination region is covered by a silicon carbide surface layer comprising an increased density of intrinsic point defects in comparison to a density of intrinsic point defects of the buried lateral silicon carbide edge termination region,
wherein the increased density of intrinsic point defects is caused by an increased density of carbon vacancy defects.

2. The silicon carbide device according to claim 1, wherein a thickness of the buried lateral silicon carbide edge termination region is larger than a thickness of the silicon carbide surface layer.

3. The silicon carbide device according to claim 1, wherein the buried lateral silicon carbide edge termination region comprises a thickness between 200 nm and 5 µm.

4. The silicon carbide device according to claim 1, wherein the silicon carbide surface layer comprises a thickness between 20 nm and 2 µm.

5. The silicon carbide device according to claim 1, wherein the first conductivity type is an n-doping and the second conductivity type is a p-doping.

6. The silicon carbide device according to claim 1, wherein the silicon carbide surface layer is part of the epitaxial silicon carbide layer, and wherein the buried lateral silicon carbide edge termination region is an implant region manufacturable by implanting ions of the second conductivity type into the epitaxial silicon carbide layer through a surface region of the epitaxial silicon carbide layer.

7. The silicon carbide device according to claim 1, wherein the epitaxial silicon carbide layer comprises the buried lateral silicon carbide edge termination region, and wherein the silicon carbide surface layer is an epitaxial layer deposited on the epitaxial silicon carbide layer.

8. The silicon carbide device according to claim 7, wherein the silicon carbide surface layer is manufacturable by depositing a low-doped epitaxial layer and implanting the transition metal or by depositing a transition metal doped epitaxial layer.

9. The silicon carbide device according to claim 1, wherein the buried lateral silicon carbide edge termination region comprises a varying lateral doping concentration, and wherein the doping concentration decreases towards an edge of the silicon carbide device.

10. The silicon carbide device according to claim 1, wherein the silicon carbide surface layer comprises a higher average or maximal transition metal doping concentration than an average or maximal doping concentration of the epitaxial silicon carbide layer.

11. The silicon carbide device according to claim 1, wherein the silicon carbide surface layer extends laterally from a lateral end of the buried lateral silicon carbide edge termination region close to the edge of the silicon carbide device to at least a metal layer electrically connected to an active area of the silicon carbide device, and wherein the active area is uncovered by the silicon carbide surface layer.

12. The silicon carbide device according to claim 1, wherein the buried lateral silicon carbide edge termination region laterally ends with a predefined distance to the edge of the silicon carbide device, so that at least a lateral end of the buried lateral silicon carbide edge termination region located close to the edge of the silicon carbide device is surrounded by silicon carbide with the first conductivity type and the silicon carbide surface layer.

13. The silicon carbide device according to claim 1, wherein the buried lateral silicon carbide edge termination region surrounds an active area of the silicon carbide device.

14. A silicon carbide device comprising:
an epitaxial silicon carbide layer comprising an n-doping; and
a buried lateral silicon carbide edge termination region located within the epitaxial silicon carbide layer comprising p-doping,
wherein the buried lateral silicon carbide edge termination region is covered by a silicon carbide surface layer comprising a sheet resistance larger than $1*10^9$ Ohm per square.

15. The silicon carbide device according to claim 1, wherein the silicon carbide device comprises a Schottky diode, a merged pin Schottky diode, a p-n-diode, a bipolar transistor, a field effect transistor, a metal oxide semiconductor transistor or a junction gate field effect transistor.

16. A method for manufacturing a silicon carbide device, the method comprising:
forming a buried lateral silicon carbide edge termination region located within an epitaxial silicon carbide layer, the epitaxial silicon carbide layer comprises a first conductivity type and the buried lateral silicon carbide edge termination region comprises a second conductivity type; and
forming a silicon carbide surface layer comprising a doping of ions of a transition metal or comprising an increased density of intrinsic point defects in comparison to a density of intrinsic point defects of the buried lateral silicon carbide edge termination region, so that the buried lateral silicon carbide edge termination region is covered by a silicon carbide surface layer,
wherein the silicon carbide surface layer comprises a sheet resistance larger than $1*10^9$ Ohm per square.

17. The method according to claim 16, wherein the buried lateral silicon carbide edge termination region is formed by implanting ions of the second conductivity type into a deep region of the epitaxial silicon carbide layer, and wherein the silicon carbide surface layer is formed by implanting transition metal ions into a shallow surface region of the epitaxial silicon carbide layer so that the silicon carbide surface layer is disposed on the buried lateral silicon carbide edge termination region.

18. The method according to claim 16, wherein the buried lateral silicon carbide edge termination region is formed by implanting ions of the second conductivity type into a surface region of the epitaxial silicon carbide layer so that the buried lateral silicon carbide edge termination region is exposed at the surface of the epitaxial silicon carbide layer, and wherein the silicon carbide surface layer is formed on the epitaxial silicon carbide layer so that the buried lateral silicon carbide edge termination region is covered by the silicon carbide surface layer.

19. The method according to claim 18, wherein the silicon carbide surface layer is formed by depositing an n-doped epitaxial layer and implanting the transition metal or by depositing a transition metal doped epitaxial layer.

20. The method according to claim 16, wherein the silicon carbide surface layer comprising an increased density of intrinsic point defects and is formed by an implantation of silicon or an electron irradiation.

21. The method according to claim 16, further comprising removing the silicon carbide surface layer at an active area of the silicon carbide device.

22. A silicon carbide device, comprising:
an epitaxial silicon carbide layer comprising a first conductivity type; and
a buried lateral silicon carbide edge termination region located within the epitaxial silicon carbide layer comprising a second conductivity type,
wherein the buried lateral silicon carbide edge termination region is covered by a silicon carbide surface layer comprising a doping of ions of a transition metal or an increased density of intrinsic point defects in comparison to a density of intrinsic point defects of the buried lateral silicon carbide edge termination region,
wherein the silicon carbide surface layer comprises a sheet resistance larger than $1*10^9$ Ohm per square.

* * * * *

UNITED STATES PATENT AND TRADEMARK OFFICE
CERTIFICATE OF CORRECTION

PATENT NO. : 9,245,944 B2
APPLICATION NO. : 13/933686
DATED : January 26, 2016
INVENTOR(S) : R. Rupp et al.

It is certified that error appears in the above-identified patent and that said Letters Patent is hereby corrected as shown below:

Title Page

Other Publications, page 1, column 2, line 1, please change "Tan et al. High-Voltage Accumulation-Layer UMOSFET's in" to -- Tan, et al. High-Voltage Accumulation-Layer UMOSFET's in --

Other Publications, page 2, column 1, line 1, please change "Hatayama et al." to -- Hatayama, et al. --

Other Publications, page 2, column 2, line 4, please change "Gaurd Rings" to -- Guard Rings --

Signed and Sealed this
Sixteenth Day of August, 2016

Michelle K. Lee
*Director of the United States Patent and Trademark Office*